United States Patent
Sato et al.

(10) Patent No.: US 7,858,517 B2
(45) Date of Patent: Dec. 28, 2010

(54) METHOD OF MANUFACTURING SEMICONDUCTOR DEVICE, AND SEMICONDUCTOR DEVICE

(75) Inventors: Naoyuki Sato, Kanagawa (JP); Kohjiro Nagaoka, Kanagawa (JP); Takashi Shinyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 62 days.

(21) Appl. No.: 11/939,251

(22) Filed: Nov. 13, 2007

(65) Prior Publication Data

US 2008/0116532 A1    May 22, 2008

(30) Foreign Application Priority Data

Nov. 16, 2006    (JP) .............................. 2006-309828

(51) Int. Cl.
- *H01L 21/44* (2006.01)
- *H01L 21/285* (2006.01)
- *H01L 21/28* (2006.01)
- *H01L 21/336* (2006.01)

(52) U.S. Cl. .................. 438/644; 438/655; 438/682; 257/E21.165; 257/E21.199; 257/E21.438

(58) Field of Classification Search ................. 438/655, 438/664, 682
See application file for complete search history.

(56) References Cited

U.S. PATENT DOCUMENTS

| | | | | |
|---|---|---|---|---|
| 2004/0173815 | A1* | 9/2004 | Yeo et al. ..................... | 257/192 |
| 2004/0266124 | A1* | 12/2004 | Roy et al. .................... | 438/307 |
| 2005/0282324 | A1* | 12/2005 | Ohuchi ........................ | 438/198 |
| 2006/0134873 | A1* | 6/2006 | Koontz ........................ | 438/301 |
| 2007/0221959 | A1* | 9/2007 | Zhu et al. .................... | 257/213 |

FOREIGN PATENT DOCUMENTS

JP    2002-530864    9/2002

* cited by examiner

*Primary Examiner*—Savitri Mulpuri
*Assistant Examiner*—Calvin Choi
(74) *Attorney, Agent, or Firm*—SNR Denton US LLP

(57) ABSTRACT

First, in a first step, a gate electrode is formed over a silicon substrate, with a gate insulation film therebetween. Next, in a second step, etching with the gate electrode as a mask is conducted so as to dig down a surface layer of the silicon substrate. Subsequently, in a third step, a first layer including an SiGe layer is epitaxially grown on the dug-down surface of the silicon substrate. Next, in a fourth step, a second layer including an SiGe layer lower than the first layer in Ge concentration or including an Si layer is formed on the first layer. Thereafter, in a fifth step, at least the surface side of the second layer is silicided, to form a silicide layer.

7 Claims, 7 Drawing Sheets

METHOD OF MANUFACTURING SEMICONDUCTOR DEVICE, AND SEMICONDUCTOR DEVICE

CROSS REFERENCES TO RELATED APPLICATIONS

The present invention contains subject matter related to Japanese Patent Application JP 2006-309828 filed in the Japan Patent Office on Nov. 16, 2006, the entire contents of which being incorporated herein by reference.

BACKGROUND OF THE INVENTION

1. Field of the Invention

The present invention relates to a method of manufacturing a semiconductor device and to a semiconductor device, particularly to a MOS (Metal Oxide Semiconductor) type field effect transistor.

2. Description of the Related Art

In recent years, for obtaining enhanced transistor performance, investigations have been made of application of a stress to a channel region so as to increase the drain current. As a technique of applying a stress, a method has been reported in which after the formation of a gate electrode, a film having a high stress is formed so as to apply a stress to the channel region. Also, a method has been reported in which the source/drain regions of a P-channel MOS type field effect transistor (PMOSFET) are etched, and a silicon-germanium (SiGe) layer is epitaxially grown in the etched portion so as to apply a stress to the channel region (refer to, for example, JP-A-2002-530864 (refer, particularly, to FIG. 4 and Paragraph No. 0030)). The application of a stress to the channel region by use of the SiGe layer is more effective as the SiGe layer is nearer to the channel region and as the volume of the SiGe layer is greater.

Here, a method of manufacturing the PMOSFET as above-mentioned will be described referring to FIGS. 3A to 3G. First, as shown in FIG. 3A, device isolation regions (omitted in the figure) are formed on the face side of a silicon substrate 11. Next, a gate electrode 13 including polysilicon is patternedly formed over the silicon substrate 11, with a gate insulation film 12 including silicon oxide therebetween. In this case, materials constituting the gate insulation film 12 and the gate electrode 13 and a hard mask 14 including a silicon nitride film are stackedly formed over the silicon substrate 11, and the stacked films are patterned by etching.

Next, as shown in FIG. 3B, a silicon nitride film 15' is formed over the silicon substrate 11 in the state of covering the gate insulation film 12, the gate electrode 13 and the hard mask 14. Thereafter, as shown in FIG. 3C, the silicon nitride film 15' (see FIG. 3B) is etched back by a dry etching method, to form side walls 15 on both sides of the gate insulation film 12, the gate electrode 13 and the hard mask 14.

Subsequently, as shown in FIG. 3D, by using the hard mask 14 and the side walls 15 as a mask, the so-called recess etching which includes digging down the silicon substrate 11 is conducted, to form recess regions 16. Thereafter, by a cleaning treatment using diluted hydrofluoric acid, a natural oxide film on the surface of the substrate is removed.

Next, as shown in FIG. 3E, a silicon-germanium (SiGe) layer 17 is epitaxially grown on the surfaces of the recessed regions 16, i.e., on the dug-down surfaces of the silicon substrate 11. This results in formation of an SiGe layer 17 containing Ge in a predetermined concentration. Thereafter, a p-type impurity is introduced into the SiGe layer 17 by an ion implantation method, and activating anneal is conducted. As a result, the SiGe layer 17 constitutes source/drain regions, and the region, located beneath the gate electrode 13 and located between the source/drain regions, of the silicon substrate 11 becomes a channel region Ch.

Next, as shown in FIG. 3F, the hard mask 14 (see FIG. 3E) is removed by wet etching in which hot phosphoric acid is used, whereby the surface of the gate electrode 13 is exposed, and the natural oxide film on the surface of the SiGe layer 17 is removed. By this removing step, upper parts of the side walls 15 are also removed.

Subsequently, as shown in FIG. 3G, a high melting point metal film such as a nickel film is formed over the silicon substrate 11, inclusive of the areas on the SiGe layer 17, in the state of covering the gate electrode 13. Thereafter, a heat treatment is conducted, whereby the surface side of the gate electrode 13 and the surface side of the SiGe layer 17 are silicided, to form a silicide layer S including nickel silicide. As a result, the resistance on the surface side of the source/drain regions is lowered, and a lowered contact resistance is realized.

When the channel region Ch is strained by application of a stress thereto by the SiGe layer 17 as above-mentioned, a PMOSFET having a sufficient carrier mobility can be obtained.

SUMMARY OF THE INVENTION

In the above-mentioned method of manufacturing a semiconductor device, however, though an enhanced carrier mobility can be contrived through the application of a stress to the channel region Ch by the SiGe layer 17, local progress of siliciding would occur in the process of siliciding the surface side of the SiGe layer 17, since the rate of reaction between the high melting point metal and silicon (Si) is higher than the rate of reaction with germanium (Ge). This tends to render the reaction instable, and makes it difficult to form the silicide layer S in a uniform membrane-like form. Therefore, it may be hard to lower the resistance of the source/drain regions. In addition, since the coefficient of diffusion of the high melting point metal into silicon is high, the silicide layer S would grow abnormally to the silicon substrate 11 when the reaction is locally started. This would lead also to an increased leakage current.

Thus, there is a need for a method of manufacturing a semiconductor device, and a semiconductor device obtained thereby, such that a silicide layer is formed in a membrane-like form and abnormal growth of the silicide layer is restrained, while applying a stress to a channel region.

In accordance with an embodiment of the present invention, there is provided a method of manufacturing a semiconductor device, including: a first step of forming a gate electrode over a silicon substrate, with a gate insulation film therebetween; a second step of digging down a surface layer of the silicon substrate by etching with the gate electrode as a mask; a third step of epitaxially growing a first layer including a silicon-germanium (SiGe) layer over the dug-down surface of the silicon substrate; a fourth step of forming a second layer including a silicon-germanium (SiGe) layer lower than the first layer in germanium concentration or including a silicon layer, over the first layer; and a fifth step of siliciding at least the surface side of the second layer to form a silicide layer.

According to the method of manufacturing a semiconductor device as just-mentioned, the first layer including the SiGe layer is epitaxially grown in the dug-down region of the silicon substrate, whereby a stress is applied to the channel region, so that an enhanced carrier mobility can be obtained. In addition, since the second layer including a SiGe layer lower than the first layer in germanium (Ge) concentration or including an Si layer is formed over the first layer, local progress of siliciding is restrained. This makes it possible to stabilize the siliciding reaction, to form the silicide layer in a uniform membrane-like form, and to realize a lowered contact resistance. Furthermore, since the first layer is higher than the second layer in germanium concentration, the first layer functions as a stopper for restraining the siliciding reaction. This prevents the silicide layer from growing abnormally to the silicon substrate, and ensures a suppressed leakage current.

In accordance with another embodiment of the present invention, there is provided a semiconductor device including a gate electrode provided over a silicon substrate, with a gate insulation layer therebetween, wherein a first layer including a silicon-germanium layer and a second layer including a silicon-germanium layer lower than the first layer in germanium concentration or including a silicon layer are sequentially stacked in this order in dug-down regions, on both sides of the gate electrode, of the silicon substrate; and a silicide layer is provided at least on the surface side of the second layer.

The semiconductor device as just-mentioned is manufactured by the above-mentioned manufacturing method, wherein a stress is applied to the channel layer by the first layer including the SiGe layer, whereby an enhanced carrier mobility is obtained. In addition, since the silicide layer is provided in the second layer which is disposed over the first layer and which includes an SiGe layer lower than the first layer in Ge concentration or includes an Si layer, a lowered contact resistance can be promised.

As has been mentioned above, according to the method of manufacturing a semiconductor device and the semiconductor device based on the present invention, it is possible to realize a lowered contact resistance and a suppressed leakage current while keeping an enhanced carrier mobility. Accordingly, enhanced transistor characteristics can be realized.

DETAILED DESCRIPTION OF THE PREFERRED EMBODIMENTS

Now, some embodiments of the present invention will be described in detail below, based on the drawings. In each of the embodiments, the configuration of a semiconductor device will be described in the order of manufacturing steps thereof.

First Embodiment

As an example of an embodiment of the method of manufacturing a semiconductor device based on the present invention, a method of manufacturing a PMOSFET in a CMOS (Complementary Metal Oxide Semiconductor) FET will be described below referring to manufacturing step sectional views shown in FIGS. 1A to 1J. Incidentally, the same configurations as those described in the background art above will be denoted by the same symbols as used above, in the following description.

Figure 1A:
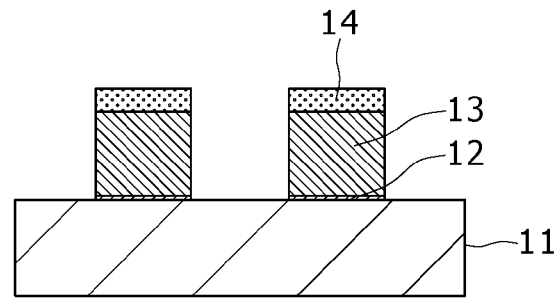
FIGS. 1A to 1J are manufacturing step sectional views for illustrating a first embodiment of the method of manufacturing a semiconductor device based on the present invention.

First, as shown in FIG. 1A, a P-type silicon substrate 11 including a single-crystal silicon is prepared, and device isolation regions (omitted in the figures) are formed on the face side of the silicon substrate 11. In this case, for example, trenches are formed on the face side of the silicon substrate 11, and the trenches are filled, for example, with an insulating film including a silicon oxide film, thereby forming device isolation regions of the STI (shallow trench isolation) structure.

Next, a gate electrode 13 including polysilicon, for example, is patternedly formed over the silicon substrate 11 isolated by the device isolation regions, with a gate insulation film 12 including a silicon oxynitride film, for example, therebetween. In this case, respective material films constituting the gate insulation film 12 and the gate electrode 13 and a hard mask 14 including a silicon nitride film, for example, are stackedly formed over the silicon substrate 11, and the stacked films are subjected to pattern etching.

Here, the material constituting the gate insulation film 12 is not limited to the silicon oxynitride film; it may be a silicon oxide film, or may be a metal oxide film including hafnium or aluminum. In addition, the gate electrode 13 is not limited to polysilicon, and may contain a metallic material.

Figure 1B:
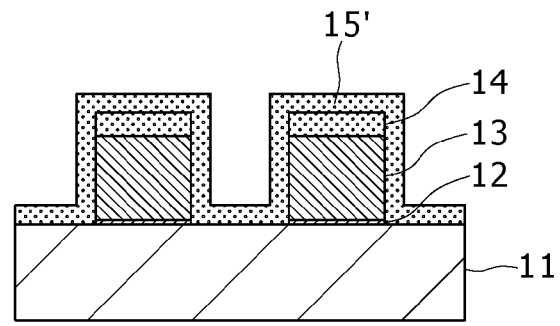
Figure 1C:
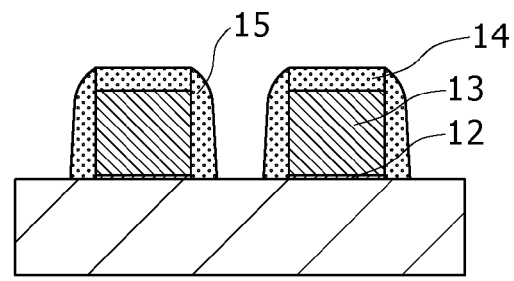

Next, as shown in FIG. 1B, a silicon nitride film 15', for example, is formed over the silicon substrate 11 in the state of covering the gate insulation film 12, the gate electrode 13, and the hard mask 14. Subsequently, as shown in FIG. 1C, the silicon nitride film 15' (see FIG. 1B) is etched back by, for example, a dry etching method, to form insulating side walls 15 on side walls of the gate insulation film 12, the gate electrode 13, and the hard mask 14. While the side walls 15 are configured by use of, for example, the silicon nitride film here, the side walls 15 may be configured by use of other film than the silicon nitride film, for example, a silicon oxide film, a silicon oxynitride film or a stacked structure of these.

Figure 1D:
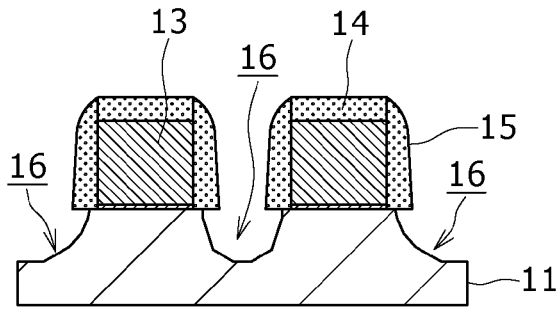

Next, as shown in FIG. 1D, recess etching for digging down the surface of the silicon substrate 11 is conducted. In this case, by etching in which the hard mask 14 on the gate electrode 13 and the side walls 15 are used as a mask, the recess etching of digging down the surface layer of the silicon substrate 11 is carried out, whereby recess regions 16 are formed. In the recess etching, isotropic etching is performed so that the recess regions 16 can be widened to under the side walls 15. For example, the silicon substrate 11 under the side walls 15 is etched by about 25 nm. It is to be noted here, however, that in the present invention it suffices that spaces for forming an SiGe layer as will be described later are present under the side walls 15, so that the width of the side walls 15 and the silicon etching amount relevant thereto are not specifically limited. Thereafter, a cleaning treatment using diluted hydrofluoric acid is conducted so as to remove a natural oxide film present at the surface of the silicon substrate 11.

Exemplary conditions for this etching include an etching gas composed of tetrafluorocarbon ($CF_4$) and oxygen ($O_2$), gas flow rates of $CF_4/O_2$=40/10 (ml/min), a treating pressure of 2.7 Pa, a source power of 500 W, and a bias power of 50 W. It is to be noted that the gas flow rates are in terms of volume flow rate in the standard condition, here and hereinafter.

Incidentally, while description is made here of an example in which the recess etching is conducted in the condition where the side walls 15 have been provided, the present invention is applicable also to the case where recess etching is conducted in the absence of the side walls 15.

Besides, while the description is centered on the method of manufacturing a PMOSFET in this embodiment and detailed description is therefore omitted here, in the case of forming an NMOSFET it suffices that before the above-mentioned etching step, a silicon oxide film for protecting NMOSFET regions is formed over the silicon substrate 11 in the state of covering the hard mask 14 and the side walls 15, only the silicon oxide film in the PMOSFET regions is removed, and thereafter the etching step is conducted.

Figure 1E:
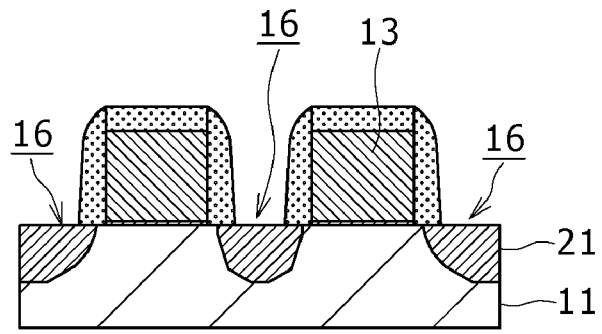

Next, as shown in FIG. 1E, a first layer 21 including a SiGe layer is epitaxially grown on the surfaces of the recess regions 16, i.e., on the dug portions of the surface of the silicon substrate 11. This results in that a compressive stress is applied to a channel region provided in the silicon substrate 11 beneath the gate electrode 13. Here, the concentration of Ge in the first layer 21 is set in the range of 10 to 20 atm %, whereby the stress can be efficiently applied to the channel region, and carrier mobility is enhanced. The thickness of the first layer 21 is not particularly limited. For further efficient application of the stress to the channel region provided in the silicon substrate 11 just beneath the gate electrode 13, however, it is preferable to provide the first layer 21 so that its surface is substantially flush with the surface of the silicon substrate 11. Here, the first layer 21 is provided so that its surface is substantially flush with the surface of the silicon substrate 11. In addition, as will be described later, the first layer 21 is higher in Ge concentration than the second layer to be formed over the first layer 21, and, due to the difference in Ge concentration, the first layer 21 functions as a stopper layer for stopping a siliciding reaction in forming a silicide layer in the second layer.

Exemplary conditions for formation of the first layer 21 as above include a film forming gas including dichlorosilane (DCS), germanium hydride (GeH$_4$) diluted with hydrogen (H$_2$) to 1.5 vol %, and hydrogen chloride (HCl), and gas flow rates of DCS/GeH$_4$/HCl=50/70/25 (ml/min), together with a treating temperature of 550 to 850° C., and a treating pressure of 1.3 to 5.3 kPa.

Figure 1F:
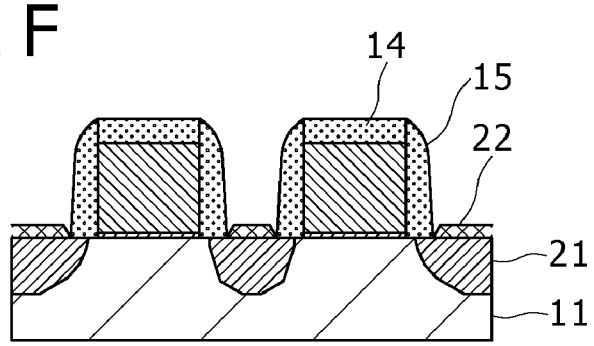

Next, as shown in FIG. 1F, the second layer 22 including an SiGe layer lower than the first layer 21 in Ge concentration or including an Si layer is formed over the first layer 21. Since a silicide layer will be formed in the second layer 22 as described later, it is preferable that the second layer 22 has a low Ge concentration. Specifically, it is preferable that the second layer 22 is lower than the first layer 21 in Ge concentration by at least 1 atm %, and it is more preferable that the second layer 22 is an Si layer. Here, for example, an Si layer is epitaxially grown as the second layer 22. Since the first layer 21 here is provided in the state of reaching the surface of the silicon substrate 11, the second layer 22 is formed in the state of swelling up from the surface of the silicon substrate 11 and in a thickness of 20 nm, for example.

The conditions for formation of the second layer 22 include, for example, a film forming gas composed of DCS, a gas flow rate of 100 to 200 ml/min, a treating temperature of 550° C., and a treating pressure of 1.3 kPa.

Incidentally, while the Si layer is described here to be epitaxially grown, in view of the subsequent formation of the silicide layer in this Si layer as above-mentioned, the Si layer may be formed by other method than the epitaxial growth, to form polysilicon.

Subsequently, by using the hard mask 14 and the side walls 15 as a mask, ion implantation with, for example, an energy of 2 keV and a dose of $3\times10^{15}$/cm$^2$ is conducted in the PMOSFET regions, whereby a p-type impurity including boron (B), for example, is introduced into the first layer 21 and the second layer 22 in these regions. On the other hand, ion implantation with, for example, an energy of 8 keV and a dose of $1\times10^{15}$/cm$^2$ is conducted in the NMOSFET regions, whereby an n-type impurity including phosphorus (P), for example, is introduced into the silicon substrate 11 in these regions.

Figure 1G:
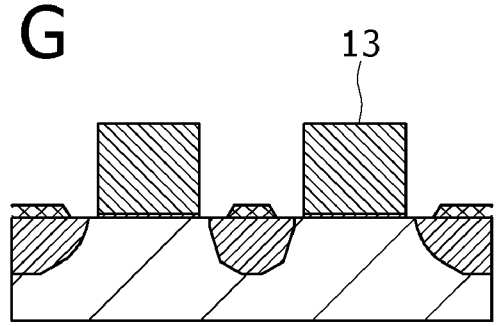

Next, as shown in FIG. 1G, by a cleaning treatment using a liquid chemical such as hot phosphoric acid, the hard mask 14 (see FIG. 1F) and the side walls 15 (see FIG. 1F) are removed, to expose the gate electrode 13. Thereafter, an activating anneal is conducted at a temperature of about 1050° C., for example.

Figure 1H:
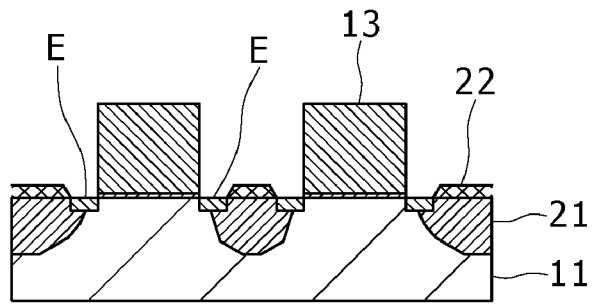

Next, as shown in FIG. 1H, by using the gate electrode 13 as a mask, ion implantation with, for example, an energy of 1.5 keV and a dose of $1.5\times10^{15}$/cm$^2$ is conducted in the PMOSFET regions, whereby a p-type impurity including BF$_2$, for example, is introduced into the silicon substrate 11, the first layer 21 and the second layer 22 in these regions. By this the silicon substrate 11 is provided with extension regions E on both sides of the gate electrode 13. On the other hand, an ion implantation with, for example, an energy of 1.5 keV and a dose of $1\times10^{15}$/cm$^2$ is conducted in the NMOSFET regions, whereby an n-type impurity including As, for example, is introduced into the silicon substrate 11 in these regions.

Figure 1I:
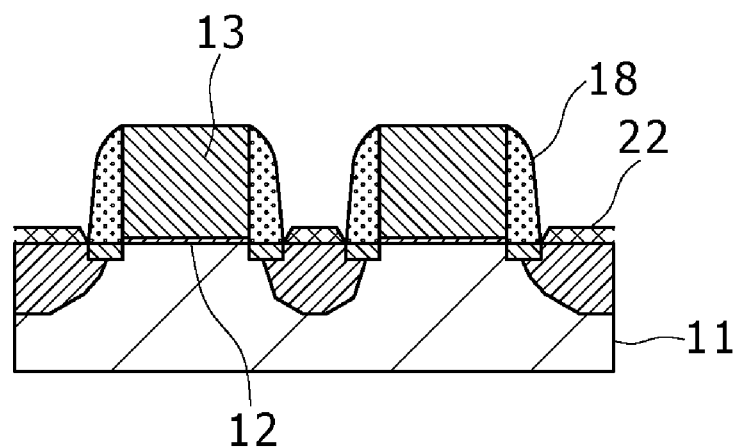

Subsequently, as shown in FIG. 1I, for example, a silicon nitride film is formed over the second layer 22 in the state of covering the gate electrode 13, and is then etched back to form side walls 18 on both sides of the gate electrode 13 and the gate insulation film 12. In order to prevent the diffusion into the channel regions of a high melting point metal which is film formed at the time of siliciding in the subsequent step, the side walls 18 are formed to be thicker than the side walls 15 described referring to FIG. 1C above. Incidentally, while the wide walls 18 are formed here of the silicon nitride film, the side walls 18 may be configured by use of other film than the silicon nitride film, for example, a silicon oxynitride film, a silicon oxide film, or a stacked film of these.

Figure 1J:
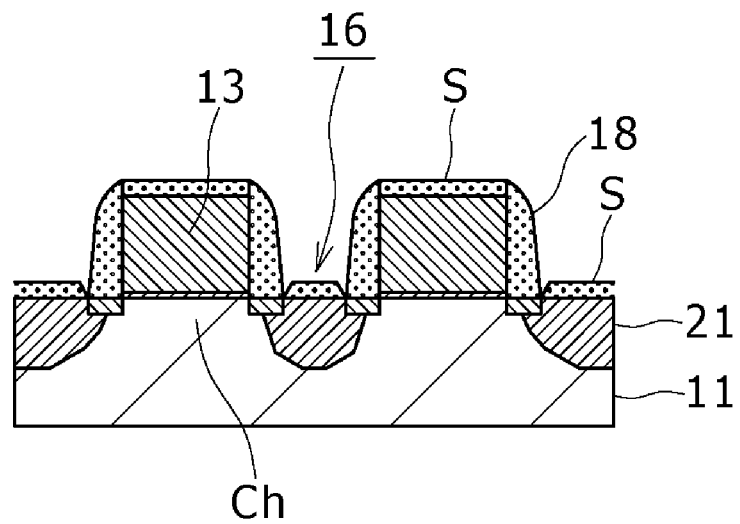

Next, as shown in FIG. 1J, a natural oxide film on the surfaces of the gate electrode 13 and the second layer 22 (see FIG. 1I) is removed, and then a high melting metal film (not shown) including nickel, for example, is formed over the silicon substrate 11 inclusive of the areas on the second layer 22 by, for example, a sputtering method, in the state of covering the gate electrode 13 provided with the side walls 18. Subsequently, the silicon substrate 11 is heated to a temperature of 250 to 400° C. at which a nickel silicide layer is formed. As a result, the gate electrode 13 and the second layer 22 are silicided on the surface side thereof, whereby a silicide layer S composed of nickel silicide is formed on the surface side of the second layer 22 and the gate electrode 13. Here, the second layer 22 is wholly silicided. In this case, since the second layer 22 is lower than the first layer 21 in Ge concentration, a uniform membrane-formed silicide layer S is formed in the second layer 22. Besides, in this case, the first layer 21 is higher than the second layer 22 in Ge concentration, and, due to this difference in Ge concentration, the first layer 21 functions as a stopper for the siliciding reaction. This ensures that abnormal growth of the silicide layer S is restrained.

Subsequently, the unreacted nickel film remaining on the device isolation regions (omitted in the figures) and on the side walls 18 is selectively removed by use of mixed acid (a mixture of sulfuric acid and hydrogen peroxide), followed by again heating to a temperature of 450 to 650° C. for improving the film quality of the silicide layer S. Incidentally, while nickel silicide is described here to be formed as the silicide layer S, the present invention is not limited to this configuration; for example, a silicide layer S composed of nickel platinum silicide, cobalt silicide, or titanium silicide may also be formed.

In the manner as above-described, a PMOSFET in which the region, just beneath the gate electrode 13, of the silicon substrate 11 is a channel region Ch is manufactured.

According to the method of manufacturing a semiconductor device as above-described and the semiconductor device obtained thereby, the first layer 21 including the SiGe layer is epitaxially grown in the dug-down recess regions 16 of the silicon substrate 11, whereby a compressive stress is applied to the channel region Ch, so that an enhanced carrier mobility can be obtained. In addition, since the second layer 22 including the SiGe layer lower than the first layer 21 in Ge concentration or including an Si layer is formed over the first layer 21, local progress of siliciding is restrained. This makes it possible to stabilize the siliciding reaction, to form a membrane-formed silicide layer S and, therefore, to realize a lowered contact resistance. Furthermore, since the first layer 21 is higher than the second layer 22 in Ge concentration, the first layer 21 functions as a stopper for restraining the siliciding reaction. This makes it possible to prevent the silicide layer S from growing abnormally to the silicon substrate 11, and to suppress leakage current. As a result of these effects, enhanced transistor characteristics can be realized.

Second Embodiment

Now, a method of manufacturing a semiconductor device according to a second embodiment of the present invention will be described below, referring to FIGS. 2A to 2F. Incidentally, the steps including digging down the surface of a silicon substrate 11 and ranging to the formation of recess regions 16 are carried out in the same manner as the steps described referring to FIGS. 1A to 1D above.

Figure 2A:
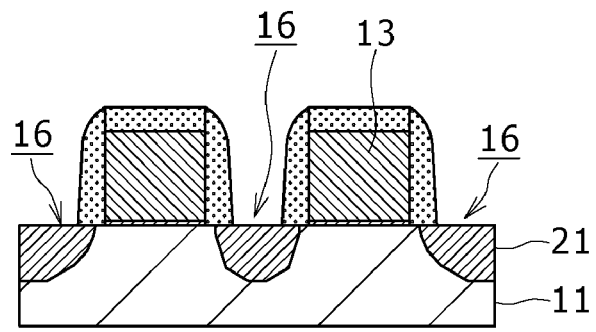
FIGS. 2A to 2F are manufacturing step sectional views for illustrating a second embodiment of the method of manufacturing a semiconductor device based on the present invention.

First, as shown in FIG. 2A, like in the first embodiment, a first layer 21 including an SiGe layer is epitaxially grown on the surfaces of the recess regions 16, i.e., the surfaces of dug-down regions of the silicon substrate 11. Here, the first layer 21 is so formed as to contain Ge in a concentration range of 10 to 20 atm %. This ensures that a compressive stress is applied to a channel region provided in a portion, beneath a gate electrode 13, of the silicon substrate 11. Here, the first layer 21 is so provided that its surface is substantially flush with the surface of the silicon substrate 11, like in the first embodiment. Incidentally, the film forming conditions are the same as in the first embodiment.

Figure 2B:
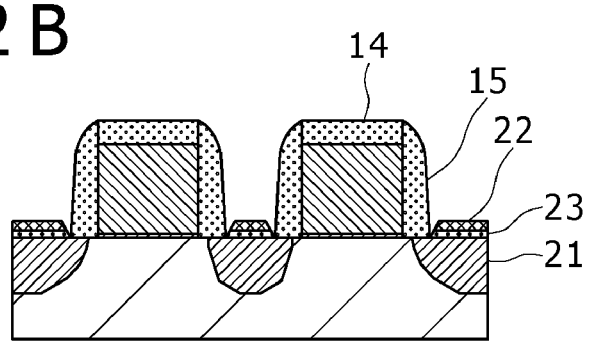

Next, as shown in FIG. 2B, an intermediate layer 23 including an SiGe layer higher than the first layer 21 in Ge concentration or including a Ge layer is formed over the first layer 21. The intermediate layer 23 functions as a stopper for a siliciding reaction at the time of forming a silicide layer in a second layer formed over the intermediate layer 23, in a later step. Therefore, the intermediate layer 23 preferably has a higher Ge concentration, and more preferably is a Ge layer. Here, a Ge layer is formed in a thickness of, for example, about 1 nm, as the intermediate layer 23.

Exemplary film forming conditions in this case include a film forming gas composed of $GeH_4$ diluted with $H_2$ to 1.5 vol %, a gas flow rate of 100 ml/min, a treating temperature of 700° C., and a treating pressure of 1.3 kPa. It is to be noted here, however, that the Ge layer is not epitaxially grown on the first layer 21 but is formed in the state of being adsorbed on the surface of the first layer 21.

Incidentally, while the intermediate layer 23 is here composed of the Ge layer, the intermediate layer 23 may be an SiGe layer which is higher than the first layer 21 in Ge concentration. In this case, the intermediate layer 23 composed of the SiGe layer is so formed as to have a Ge concentration of more than 20 atm %.

Next, a second layer 22 including an SiGe layer lower than the first layer 21 in Ge concentration or including an Si layer is formed over the intermediate layer 23. Here, like in the first embodiment, an Si layer is formed under the same film forming conditions as in the first embodiment as the second layer 22. In this case, since the Si layer is formed on the Ge layer, the Si layer is not epitaxially grown but is formed in the state of being adsorbed on the Ge layer.

The subsequent steps are carried out in the same manner as the steps described referring to FIGS. 1G to 1J in the first embodiment above. Specifically, by using a hard mask 14 and side walls 15 as a mask, a p-type impurity is introduced into the second layer 22, the intermediate layer 23, and the first layer 21.

Figure 2C:
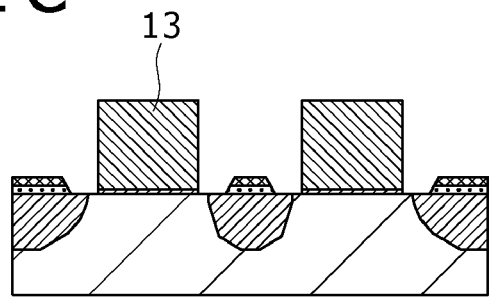
Figure 2D:
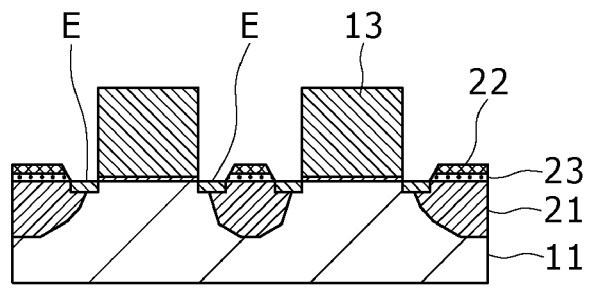

Next, as shown in FIG. 2C, the hard mask 14 (see FIG. 2B) and the side walls 15 (see FIG. 2B) are removed, to expose the gate electrode 13. Thereafter, as shown in FIG. 2D, an activating anneal is conducted at a temperature of about 1050° C., for example. Subsequently, by using the gate electrode 13 as a mask, ion implantation is conducted, to form extension regions E.

Figure 2E:
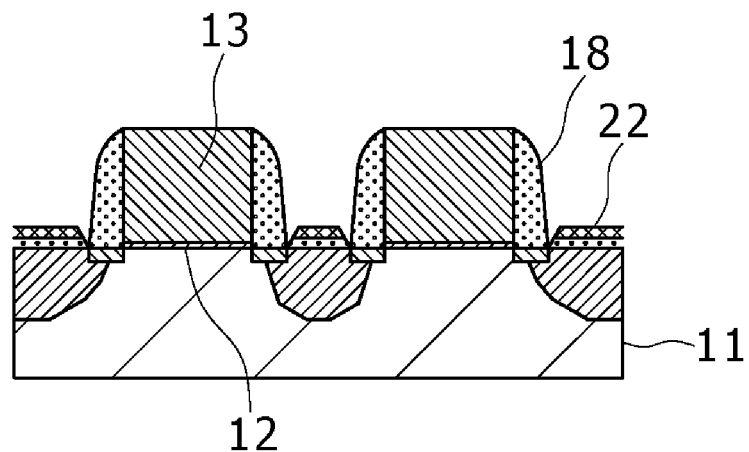

Next, as shown in FIG. 2E, side walls 18 are formed on both sides of the gate electrode 13 and a gate insulation film 12.

Figure 2F:
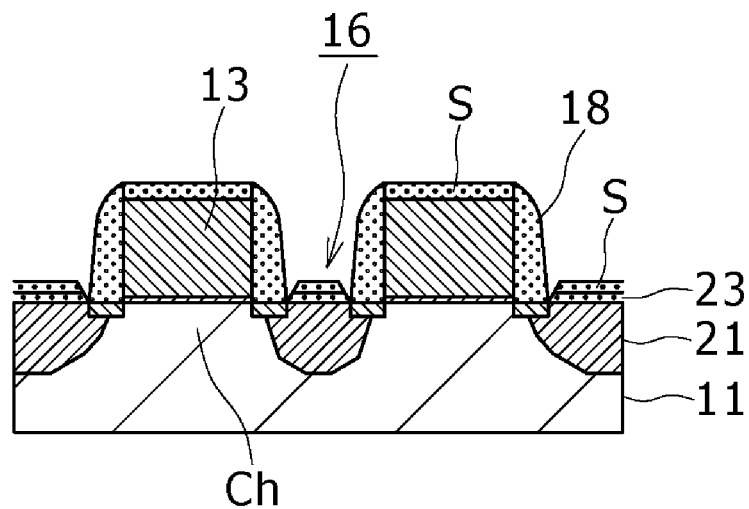
Figure 3A:
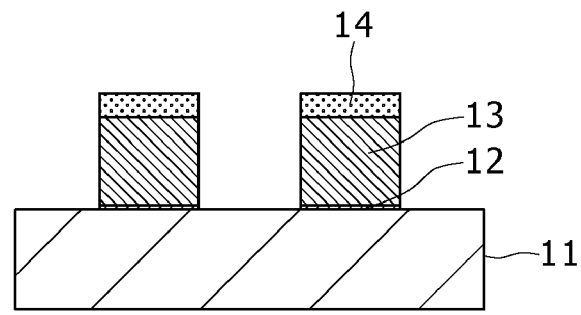
FIGS. 3A to 3G are manufacturing step sectional views for illustrating a method of manufacturing a semiconductor device according to a related art.
Figure 3B:
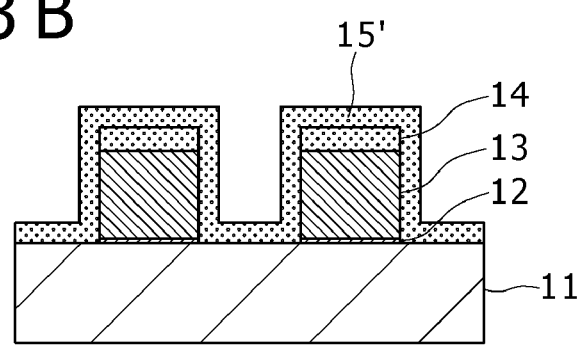
Figure 3C:
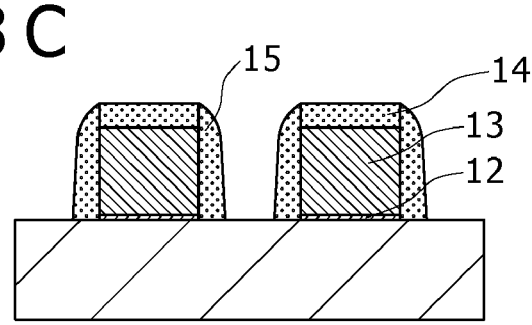
Figure 3D:
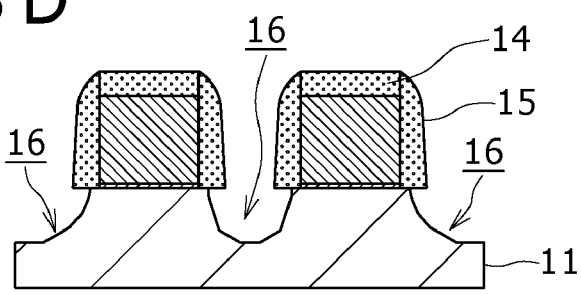
Figure 3E:
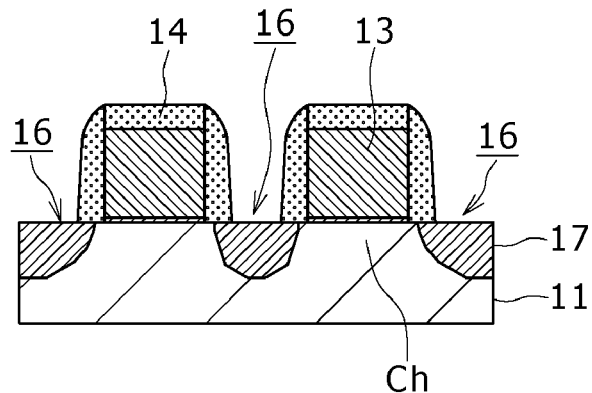
Figure 3F:
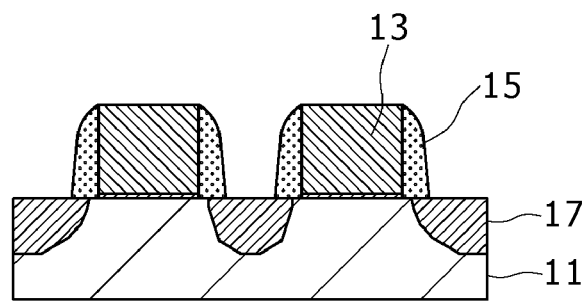
Figure 3G:
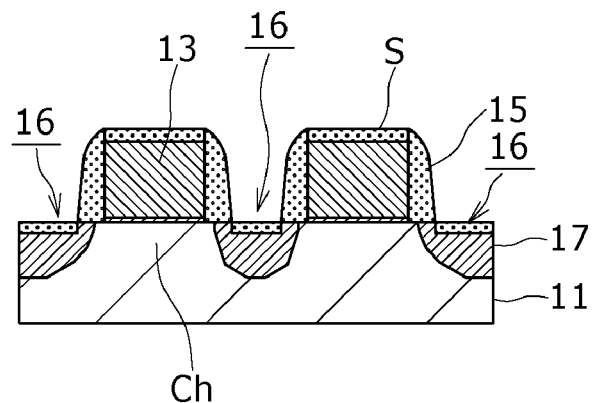

Subsequently, as shown in FIG. 2F, a natural oxide film on the surfaces of the gate electrode 13 and the second layer 22 (see FIG. 2E) is removed, a nickel film (omitted in the figure) is formed over the silicon substrate 11, inclusive of the areas on the second layer 22, in the state of covering the gate electrode 13 provided with the side walls 18. Thereafter, a heat treatment is conducted, whereby a silicide layer S composed of nickel silicide is formed on the surface side of the second layer 22 and the gate electrode 13. In this case, since the second layer 22 is lower than the first layer 21 in Ge concentration, a uniform membrane-formed silicide layer S is formed in the second layer 22. Besides, in this case, since the intermediate layer 23 is conspicuously higher than the second layer 22 in Ge concentration, the intermediate layer 23 functions assuredly as a stopper for the siliciding reaction. This ensures that abnormal growth of the silicide layer S is restrained.

Thereafter, the unreacted high melting point metal film remaining on device isolation regions (omitted in the figures) and on the side walls 15 is selectively removed by use of mixed acid, followed by again heating to a temperature of 450 to 650° C.

In the manner as above-described, a PMOSFET in which the region, just beneath the gate electrode 13, of the silicon substrate 11 is the channel region Ch is manufactured.

In the method of manufacturing a semiconductor device as above-mentioned and the semiconductor device obtained thereby, also, the first layer 21 including the SiGe layer is epitaxially grown in the dug-down recess regions 16 of the silicon substrate 11, whereby a compressive stress is applied to the channel region Ch, so that an enhanced carrier mobility can be obtained. In addition, since the second layer 22 including an SiGe layer lower than the first layer 21 in Ge concentration or including an Si layer is formed on the intermediate layer 23, local progress of siliciding is restrained. This makes it possible to stabilize the siliciding reaction, to form a membrane-formed silicide layer S and, therefore, to realize a lowered contact resistance.

Furthermore, since the intermediate layer 23 is higher than the first layer 21 in Ge concentration, the intermediate layer 23 functions as a stopper for restraining the siliciding reaction. Especially, according to this embodiment, the intermediate layer 23 is composed of the Ge layer, whereby the silicide layer S is securely prevented from growing abnormally to the silicon substrate, and leakage current is suppressed.

As a result of these effects, enhanced transistor characteristics can be realized.

Modified Embodiment 1

While the Ge layer has been formed as the intermediate layer 23 in the second embodiment above, the Ge layer may be formed by an ion implantation method. In that case, in the step described referring to FIG. 2B above, Ge ion implantation is conducted under the conditions of, for example, an energy of 2.5 keV and a dose of $5 \times 10^{14}$ atoms/cm$^2$. As a result, a high Ge concentration region is formed in the region of the first layer 21 ranging from the surface to a depth of about 5 nm, and the intermediate layer 23 is thereby formed. Besides, after the ion implantation, a heat treatment at a temperature of about 1000° C., for example, may be conducted for recovery of crystallinity.

In the method of manufacturing a semiconductor device as above-described and the semiconductor device obtained thereby, also, the same effects as those of the second embodiment can be obtained, since the first layer 21 including the SiGe layer, the intermediate layer 23 higher than the first layer 21 in Ge concentration, and the second layer 22 lower than the first layer 21 in Ge concentration are formed over the surfaces of recess regions 16.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device, comprising:
    a first step of forming a gate electrode over a silicon substrate, with a gate insulation film between said gate electrode and silicon substrate;
    a second step of removing portions of a surface layer of said silicon substrate to create dug-down regions on opposite sides of the gate electrode by etching said surface layer using said gate electrode as a mask;
    a third step of epitaxially growing a first layer including a silicon-germanium layer over the dug-down regions of said silicon substrate until said dug-down regions are completely filled and the surface of the first layer is flush with the surface of the silicon substrate;
    a fourth step of forming over said first layer an intermediate layer including (1) a silicon-germanium layer having a germanium concentration that is higher than that of said first layer or (2) a germanium layer;
    a fifth step of forming over said intermediate layer a second layer including (1) a silicon-germanium layer having a germanium concentration that is lower than that of said first layer or (2) a silicon layer, over said first layer and at or above the surface of the substrate; and
    a sixth step of siliciding at least a surface side of said second layer facing away from said first layer to form a silicide layer,
    wherein,
        the substrate accommodates a channel region therein beneath the gate electrode, and
        the manufacturing steps cause the channel region to be strained,
        said second layer is formed over said intermediate layer in said fifth step and
        the germanium concentration of the intermediate layer is sufficient to ensure that only the second layer is silicided in the sixth step.

2. The method of manufacturing a semiconductor device as set forth in claim 1, comprising the further step of ion implanting extension regions in said surface of said substrate on opposite sides of said gate electrode while using said gate electrode as a mask.

3. The method of manufacturing a semiconductor device as set forth in claim 2, comprising the step of forming sidewall films on sidewalls of said gate electrode.

4. The method of manufacturing a semiconductor device as set forth in claim 3, comprising the further step of removing the sidewall films after the fifth step.

5. The method of manufacturing a semiconductor device as set forth in claim 4, wherein the extension regions are formed after the sidewall films are removed.

6. The method of manufacturing a semiconductor device as set forth in claim 3, comprising the further step of
    introducing an impurity to the first layer, the intermediate layer and the second layer by using the gate electrode and the sidewall film as a mask after the formation of the second layer.

7. The method of claim 1, wherein the intermediate layer is formed by ion implantation.

* * * * *